(12) United States Patent
Killian et al.

(10) Patent No.: US 7,982,459 B2
(45) Date of Patent: Jul. 19, 2011

(54) HYDRAULIC CYLINDER ROD POSITION SENSING METHOD

(75) Inventors: Michael Lee Killian, Troy, MI (US); Alexander Bogicevic, Wolverine Lake, MI (US); Ahmad Aquil, Farmington Hills, MI (US)

(73) Assignee: Eaton Corporation, Cleveland, OH (US)

( * ) Notice: Subject to any disclaimer, the term of this patent is extended or adjusted under 35 U.S.C. 154(b) by 200 days.

(21) Appl. No.: 12/493,687

(22) Filed: Jun. 29, 2009

(65) Prior Publication Data

US 2009/0322316 A1 Dec. 31, 2009

Related U.S. Application Data

(60) Provisional application No. 61/080,390, filed on Jul. 14, 2008, provisional application No. 61/133,489, filed on Jun. 30, 2008.

(51) Int. Cl.
*G01N 27/82* (2006.01)
(52) U.S. Cl. ........ 324/240; 324/228; 324/260; 376/245; 376/258
(58) Field of Classification Search ................... 324/240, 324/228, 260; 376/245, 258
See application file for complete search history.

(56) References Cited

U.S. PATENT DOCUMENTS

| | | | |
|---|---|---|---|
| 4,555,120 A | 11/1985 | Frait et al. | |
| 5,129,471 A | 7/1992 | Maurstad et al. | |
| 5,710,378 A | 1/1998 | Dykes et al. | |
| 6,142,059 A | 11/2000 | Chan et al. | |
| 6,230,822 B1 | 5/2001 | Sullivan et al. | |
| 6,234,061 B1 | 5/2001 | Glasson | |
| 6,367,366 B1 | 4/2002 | Bloom et al. | |
| 6,467,557 B1 | 10/2002 | Krueger et al. | |
| 6,694,861 B2 | 2/2004 | Glasson | |
| 7,178,446 B2 | 2/2007 | Kucher et al. | |
| 7,276,898 B2 | 10/2007 | Rosplock | |
| 7,290,476 B1 | 11/2007 | Glasson | |
| RE40,166 E | 3/2008 | Sukhorukov et al. | |
| 7,346,455 B2 | 3/2008 | Ward et al. | |
| 7,449,881 B2 | 11/2008 | Edwin et al. | |
| 7,503,310 B2 | 3/2009 | Schmidt et al. | |
| 7,518,526 B2 | 4/2009 | Newman | |
| 7,526,964 B2 | 5/2009 | Goldfine et al. | |
| 2007/0214952 A1 | 9/2007 | Kossmann | |

FOREIGN PATENT DOCUMENTS

| | | |
|---|---|---|
| DE | 3210716 A1 | 11/1982 |
| JP | 03152403 A | 6/1991 |
| JP | 04270901 A | 9/1992 |

OTHER PUBLICATIONS

Innovation: Douce Hydro SMIK: Integrated Measuring System in KERADOUCE, SMIK pp. 1-8, Feb. 2004, www.doucehydrom.com.

*Primary Examiner* — Reena Aurora
(74) *Attorney, Agent, or Firm* — Quinn Law Group, PLLC

(57) ABSTRACT

A method for detecting a position of a cylinder rod includes depositing a plurality of welds substantially along the length of a steel rod and depositing a corrosion resistant material onto the steel rod by laser cladding. The cylinder rod is then placed proximate to a sensor assembly. One of the cylinder rod and the sensor assembly are moved relative to the other. The sensor assembly detects a change in properties between the steel rod and the welds and generates a corresponding signal. A change in position of the cylinder rod or damage to the cylinder rod can be detected by analyzing the number and strength of the signals.

20 Claims, 3 Drawing Sheets

HYDRAULIC CYLINDER ROD POSITION SENSING METHOD

CROSS REFERENCE TO RELATED APPLICATION

This application claims the benefit of U.S. Provisional Patent Application No. 61/080,390, filed Jul. 14, 2008, and to U.S. Provisional Patent Application No. 61/133,489, filed Jun. 30, 2008, and which are hereby incorporated by reference in their entirety.

TECHNICAL FIELD

The invention relates to a cylinder rod, and more particularly, to a system and method for determining a cylinder rod position and method of manufacture

BACKGROUND OF THE INVENTION

One arrangement for providing position sensing for systems utilizing large cylinder rods is to form a gear teeth-like profile on the surface of the cylinder rod, which has ferromagnetic base material. A sensor element, typically a Hall Effect sensor, is mounted to a magnet. As the gear tooth profile, formed on the cylinder rod, passes the Hall Effect sensor a pulse is generated as a result of the Hall Effect sensor detecting the presence of the ferromagnetic material. Each pulse is associated with a distance of travel from one gear tooth on the cylinder rod to the next.

To form the gear teeth, grooves between each of the gear teeth must be individually machined about the circumference of the cylinder rod. Increasing the number and the proximity of the grooves increases the resolution of the pulse signal obtained for measuring the position of the cylinder rod. However, machining the grooves is a time consuming and expensive task.

Additionally, the cylinder rod is typically formed of ferromagnetic material, such as steel. Common applications of cylinder rods requiring position sensing include marine and brackish water applications, such as offshore drilling, locks, dams and draw bridges. In order to protect the cylinder rod from corrosion and other damage as a result of these environments, a corrosion resistant, thermal sprayed coating is applied. Typically, a thin bonding layer is applied to the cylinder rod, and the corrosion resistant coating is applied over that forming a mechanical bond with the bonding layer and the cylinder rod. The coating must be applied after all of the gear teeth have been formed, due to the complexity of grinding the grooves to form the gear teeth. Additionally, the two layers of non-magnetic coating reduce the sensors ability to detect the gear teeth. This limits the available thickness of the corrosion resistant coating. However, limited thickness of the corrosion resistant coating reduces the life of the cylinder rods.

SUMMARY OF THE INVENTION

A method for detecting a position of a cylinder rod and damage to the cylinder rod is provided. The method includes depositing a plurality of welds along substantially the length of a cylinder rod and depositing a corrosion resistant material onto the cylinder rod by laser cladding. The cylinder rod is placed proximate to at least one sensor assembly. One of the cylinder rod and the sensor assembly is moved relative to the other of the cylinder rod and the sensor assembly. The sensor assembly measures a change in magnetic properties of the cylinder rod to detect at least one of a change in position of the cylinder rod and damage to the cylinder rod.

A method for detecting a position of a cylinder rod is also provided. The method includes depositing a plurality of welds substantially along the length of a cylinder rod and depositing a corrosion resistant material onto the cylinder rod by laser cladding. The plurality of circumferential welds are made of a non-ferromagnetic material. The cylinder rod is polished to remove any excess corrosion resistant material. The cylinder rod is placed proximate to at least one eddy current probe. One of the cylinder rod and the eddy current probe are moved relative to the other. The eddy current or magnetic field probe measures a change in one of magnetic properties, electric properties and physical geometry of the cylinder rod to detect a change in position of the cylinder rod.

The above features and advantages and other features and advantages of the present invention are readily apparent from the following detailed description of the best modes for carrying out the invention when taken in connection with the accompanying drawings.

DESCRIPTION OF THE PREFERRED EMBODIMENTS

Figure 2:
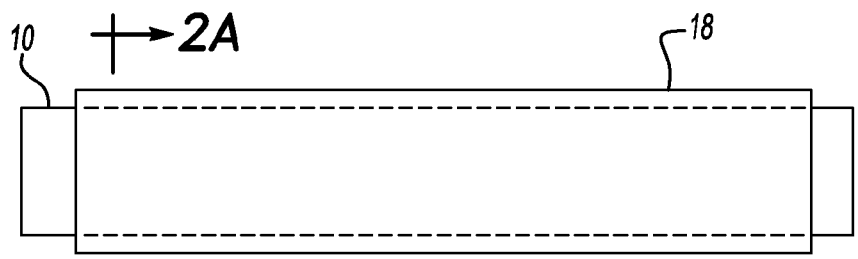
FIG. 2 is a schematic side view illustration of a first embodiment of the steel rod of FIGS. 1 and 1A having a laser cladding.
Figure 2A:
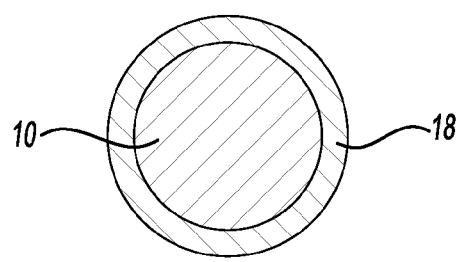
FIG. 2A is a schematic cross-sectional end view of the first embodiment of the steel rod of FIGS. 1, 1A and 2 having the laser cladding taken along the lines 2A in FIG. 2.
Figure 3:
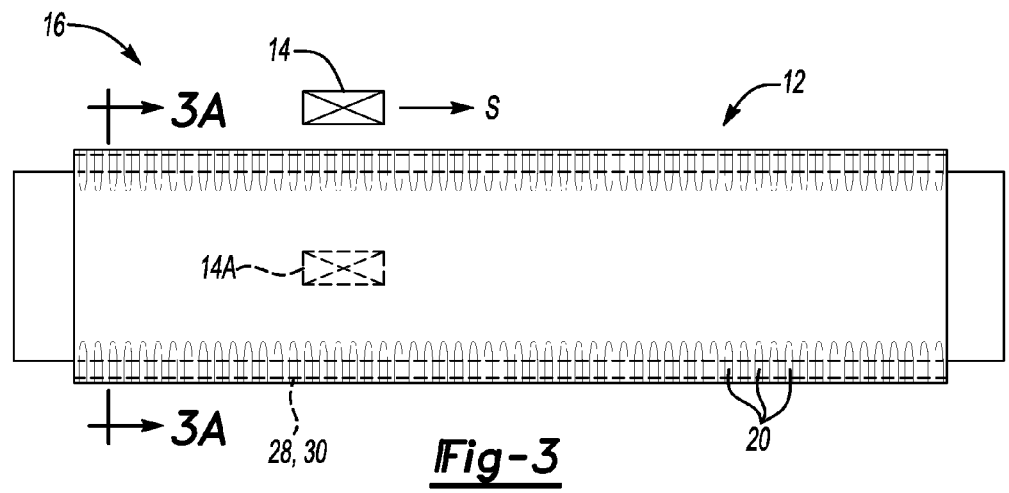
FIG. 3 is a schematic cross-sectional illustration of the first embodiment of the cylinder rod for the steel rod of FIGS. 1-2A.
Figure 3A:
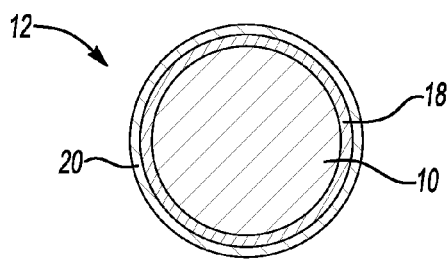
FIG. 3A is a schematic cross-sectional end view of the first embodiment of the cylinder rod for the steel rod of FIGS. 1-3 taken along the lines 3A in FIG. 3.

Referring to the drawings, wherein like reference numbers refer to like components, FIGS. 2 and 2A illustrate a steel rod 10 from which the cylinder rod 12, shown in FIGS. 3 and 3A, may be manufactured. The cylinder rod 12 and at least one sensor assembly 14 form a position sensing system 16, 116 (shown in FIGS. 3 and 5). The steel rod 10 has a generally circular cross-section. The steel rod 10 may be a solid component, as shown, or may be hollow defining an axial opening extending from one end of the steel rod 10 to the other, for reducing the weight of the steel rod 10.

Referring to FIGS. 2-3A, a first embodiment of the position sensing system 16 is illustrated. A cladding 18 is formed about the exterior surface of the steel rod 10. The cladding 18 is formed by depositing a metallic, non-ferromagnetic material on the steel rod 10. Appropriate materials may include, Nickel-based or Cobalt based metals, such as INCONEL 625™ and ULTIMET™, STELLITE 21™ and CARPENTER CCW™. The material is deposited onto the steel rod 10 in a spiral manner by fusion welding to create a fusion weld bond and form the cladding 18. The cladding 18 is applied by a laser weld to the steel rod 10 and may, thus, be referred to a laser cladding. The cladding 18 forms a solid layer over the exterior surface of the steel rod 10. As shown, the cladding 18 may cover a substantial length of the steel rod 10, but may not cover the entire length of the steel rod 10. Due to the application of the filler material to the steel rod 10 by fusion welding, the steel rod 10 mixes with the weld material as it is applied to create a new material for the cladding 18.

Referring to FIGS. 3 and 3A, a plurality of welds 20 are arranged circumferentially about the cylinder rod 12. The plurality of welds 20 are applied after the cladding 18. The plurality of welds 20 are preferably applied by laser welding. The plurality of welds 20 may be applied in an autogenous manner where no filler metal is used. Alternatively, the plurality of welds 20 may be applied using a filler material that is a dissimilar metal to the cladding 18. Preferably, the material forming the cladding 18 and the plurality of welds 20 are both formed from corrosion resistant materials. For example, Nickel-based or Cobalt based metals, such as as INCONEL 625™ and ULTIMET™, would be suitable for forming the plurality of welds 20.

Figure 1:
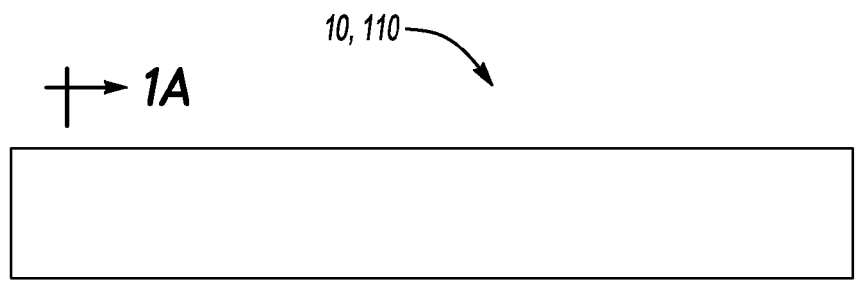
FIG. 1 is a schematic side-view illustration of a cylinder rod for a position sensing system.
Figure 1A:
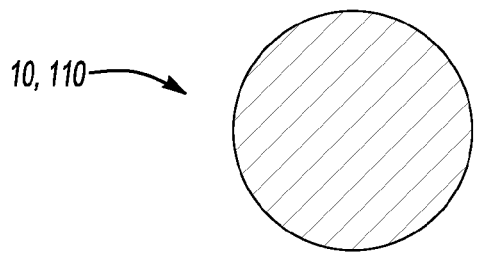
FIG. 1A is a schematic cross-sectional end view of the cylinder rod of FIG. 1 taken along the lines 1A in FIG. 1.

The plurality of welds 20 are equally spaced from one another along the length of the cladding 18. Similar to the cladding 18, the plurality of welds 20 cover substantially the length of the steel rod 10 (shown in FIG. 1) but may leave the ends exposed. The plurality of welds are uniformly applied and equidistant from one another. The smaller the weld width and the pitch (weld center-to-center spacing) between the welds, the better the resolution the position sensing system 16 will have.

The plurality of welds 20 are preferably applied by fusion welding using laser beam welding. Other types of fusion welds may also be used such as, Gas Tungsten Arc Welding (GTAW), Gas Meal Arc Welding, and Plasma Arc Welding (PAW). Alternately, a solid-state non-fusion welding method such as friction stir welding may be used to apply the plurality of welds 20.

As mentioned above, the closer the plurality of welds 20 are to one another, the more refined the distance measurement for the position sensing system 16 will be. The type of welding and whether or not filler material is used affects the pitch (center-to-center spacing) between the welds, the width of the welds, and the measurable difference between the plurality of welds 20 and the steel rod 10. One skilled in the art would be able to determine the proper type of material, welding and spacing for a particular cylinder rod sensing system 16.

After the plurality of welds 20 are applied to the steel rod 10 the steel rod 10 and the plurality of welds 18 may be ground to remove any weld cap beads formed during the welding process, illustrated in phantom at 28. The outer surface of the cylinder rod 14 may then be polished, illustrated in phantom at 30, to facilitate use of the cylinder rod 14 within the cylinder.

FIGS. 3 and 3A illustrate the cylinder rod 12 for one embodiment of the position sensing system 16. The cylinder rod 12 is for use with a cylinder to form a piston (not shown). At least one sensor assembly 14 is positioned proximate to the cylinder rod 12. A typical placement of the sensor assembly 14 may be on a cylinder head for the cylinder (not shown). Other locations may also be used for mounting or arranging the sensor assembly 14 proximate to the cylinder rod 12. One skilled in the art would know the proper placement for the sensor assembly 14 relative to the cylinder rod 12.

The sensor assembly 14 is preferably an eddy current probe or magnetic field probe. The eddy current probe consists of a driving coil and a signal coil, of a driving coil and two signal coils, or of a driving coil and Hall device(s). The sensor assembly 14 determines the position of the cylinder rod 12 as the cylinder rod 12 moves relative to the sensor assembly 14, illustrated by arrow S. Alternatively, the sensor assembly 14 may determine the position of the cylinder rod 12 as the sensor assembly 14 moves relative to the cylinder rod 12.

One sensor assembly 14 is illustrated in FIG. 3. Additional sensor assemblies 14 may also be used, as illustrated in phantom at 14A. The sensor assemblies 14, 14A would act in the same manner but provide information that is 90 degrees out of phase from one another. This would increase the resolution of the position sensing system 16.

As the sensor assembly 14 moves relative to the cylinder rod 12, the difference in magnetic properties, electric properties and physical geometry between the steel rod 10 and the plurality of welds 20 is registered by the sensor assembly 14. Specifically, in this instance, the welds 20 each produce a signal resulting from the magnetic properties, electric properties and physical geometry, which is registered as a pulse by the sensor assembly 14. The welds 20 are all equidistant, at a known distance from one another. Therefore, each pulse recorded by the sensor assembly 14 can be converted into a known distance of travel as the sensor assembly 14 moves relative to the cylinder rod 12.

Figure 4:
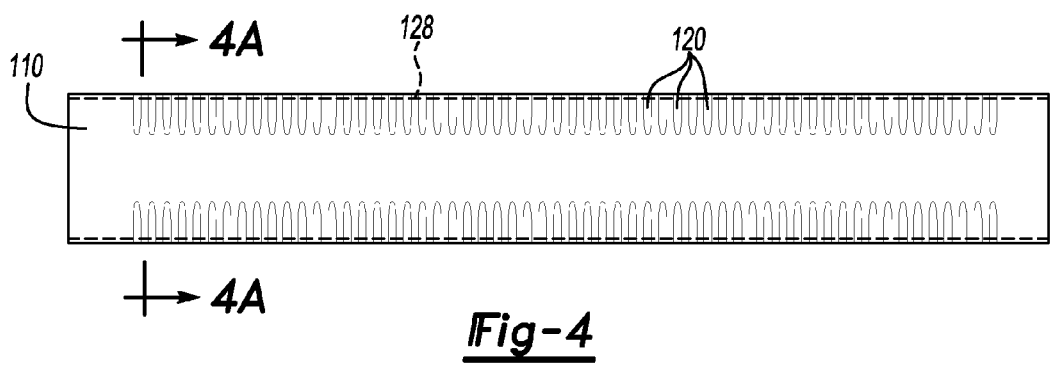
FIG. 4 is a schematic side view illustration of a second embodiment of the steel rod of FIG. 3 for the steel rod of FIGS. 1 and 1A.
Figure 4A:
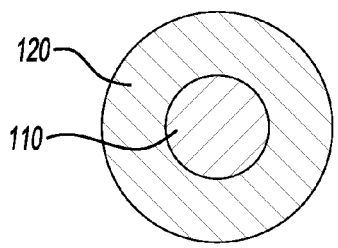
FIG. 4A is a schematic cross-sectional end view of the second embodiment of the steel rod of FIGS. 1, 1A and 4 having the plurality of welds taken along the lines 4A in FIG. 4.
Figure 5:
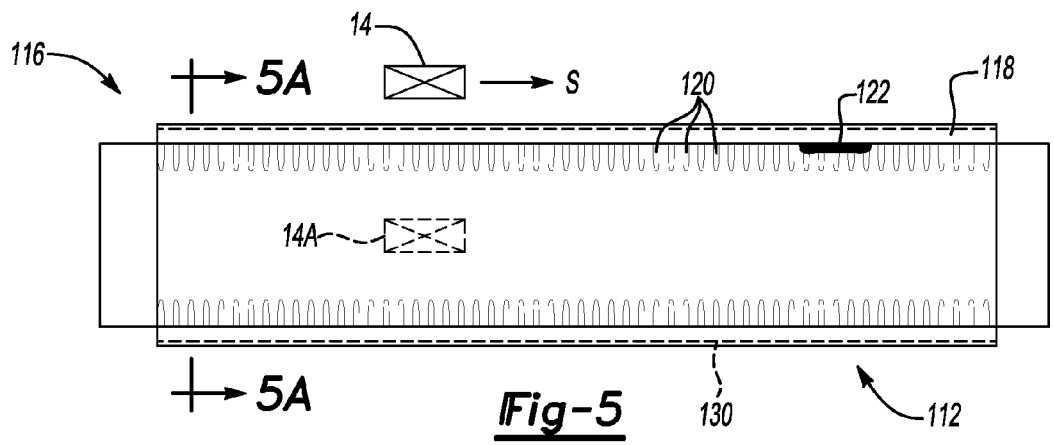
FIG. 5 is a schematic side view illustration of the second embodiment of the cylinder rod for the steel rod of FIGS. 1, 1A, 4 and 4A.
Figure 5A:
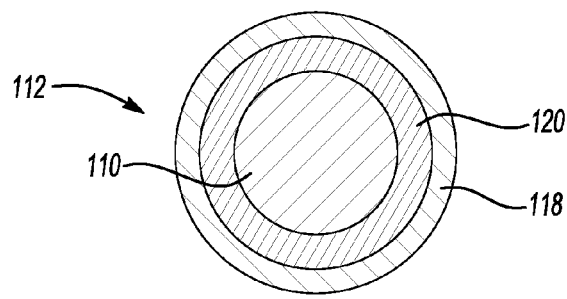
FIG. 5A is a schematic cross-sectional end view of the second embodiment of the cylinder rod of FIG. 5 for the steel rod of FIGS. 1-1A and 4-4A taken along the lines 5A in FIG. 5.

Referring to FIGS. 4 through 5A, a second embodiment of the position sensing system 116 is illustrated. A plurality of welds 120 are arranged circumferentially about a cylinder rod 112. The plurality of welds 120 are applied prior to a cladding 118. The plurality of welds 120 are preferably applied by fusion welding using laser beam welding. Other types of fusion welds may also be used such as, Gas Tungsten Arc Welding (GTAW) and Plasma Arc Welding (PAW). The plurality of welds 120 are applied using a non-ferromagnetic material or a slightly ferromagnetic material that is a dissimilar to the ferromagnetic material of the steel rod 110. Preferably, the material forming the steel rod 110 is steel and the material forming the plurality of welds 120 is a corrosion resistant material. For example, 310 Austenitic Stainless Steel would be a suitable filler material for the plurality of welds 120. Nickel-based or Cobalt based metals would also be suitable, such as INCONEL 625™ and ULTIMET™. The filler material can be in the form of rod, wire or powder. One skilled in the art would know the proper material required to provide a difference in magnetic properties between the steel rod 110 and the plurality of welds 120.

The plurality of welds 120 are equally spaced from one another along the length of the steel rod 110. The plurality of welds 120 cover substantially the length of the steel rod 110 (shown in FIG. 1) but may leave the ends exposed. The welds 120 are uniformly applied and equidistant from one another.

The smaller the weld width, and the pitch between the welds, the better the resolution the position sensing system 116 will have.

After the plurality of welds 120 are applied to the steel rod 110, the steel rod 110 and the plurality of welds 120 may be ground or polished to remove any weld beads formed during the welding process and to prepare the surface for application of a cladding 118, illustrated in phantom at 128. Removing the weld beads may increase the strength of the signal recorded by the sensor assembly 14. However, removing the weld beads is not required for the sensor assembly 14 to be able to sense the difference in magnetic properties, electric properties and physical geometry between the steel rod 110 and the plurality of welds 120.

The cladding 118 is formed about the exterior surface of the steel rod 110 and the plurality of welds 120. The cladding 118 is formed by depositing a metallic, non-ferromagnetic material on the steel rod 110 and the plurality of welds 120. Appropriate materials may include, Nickel-based or Cobalt based metals, such as INCONEL 625™ and ULTIMET™, STELLITE 21™ and CARPENTER CCW™. The material is deposited onto the steel rod 110 and the plurality of welds 120 in a spiral manner by fusion welding to form the cladding 118. The cladding 118 is applied by a laser weld and may, thus, be referred to a laser cladding. The cladding 18 forms a solid layer over the exterior surface of the steel rod 110 and the plurality of welds 120. As shown, the cladding 118 may cover a substantial length of the steel rod 110, but need not cover the entire length of the steel rod 110.

The cladding 118 is applied over the steel rod 10 and the plurality of welds 120. However, in order to speed the process of applying the plurality of welds 120 and the cladding 118, the cladding 118 application can begin immediately after the plurality of welds 120 have been applied. The distance between the application of the plurality of welds 120 and the application of the cladding 118 is dictated by the speed of the welding processes and the size of the welding apparatus that are used.

After the cladding 118 is applied over the steel rod 10 and the plurality of welds 120, the cladding 118 may be ground or polished to remove any excess material from the cladding process, illustrated in phantom at 130. Grinding or polishing the cladding 118 prepares the outer surface of the cylinder rod 14 to facilitate use of the cylinder rod 14 within the cylinder (not shown).

FIGS. 5 and 5A illustrate the cylinder rod 12 for another embodiment of the position sensing system 116. The cylinder rod 112 is for use with a cylinder to form a piston (not shown). At least one sensor assembly 14 is positioned proximate to the cylinder rod 112. A typical placement of the sensor assembly 14 may be on a cylinder head for the cylinder (not shown). Other locations may also be used for mounting or arranging the sensor assembly 14 proximate to the cylinder rod 112. One skilled in the art would know the proper placement for the sensor assembly 14 relative to the cylinder rod 112.

The sensor assembly 14 is preferably an eddy current probe. The eddy current probe consists of a driving coil and a signal coil or of a driving coil and two signal coils. The sensor assembly 14 determines the position of the cylinder rod 112 as the cylinder rod 112 moves relative to the sensor assembly 14, illustrated by arrow S. Alternatively, the sensor assembly 14 may determine the position of the cylinder rod 112 as the sensor assembly 14 moves relative to the cylinder rod 112.

One sensor assembly 14 is illustrated in FIG. 5, additional sensor assemblies 14 may also be used as illustrated in phantom at 14A. The sensor assemblies 14, 14A would act in the same manner but provide information that is 90 degrees out of phase from one another. This would increase the resolution of the position sensing system 116.

As the sensor assembly 14 moves relative to the cylinder rod 112 the difference in magnetic properties, electric properties and physical geometry between the steel rod 110 and the plurality of welds 120 is registered by the sensor assembly 14. Specifically, in this instance, the plurality of welds 120 each disrupt a signal which is produced by the magnetic properties, electric properties and physical geometry of the steel rod 110. The presence of ferromagnetic material beneath the probe is registered as a pulse by the sensor assembly 14. The plurality of welds 120 are all equidistant and at a known distance from one another. Therefore, each pulse recorded by the sensor assembly 14 can be converted into a known distance of travel as the sensor assembly 14 moves relative to the cylinder rod 112.

Referring to FIG. 5, an example of damage 122 to the cylinder rod 112 is illustrated, displayed as unexpected variance in pulses 126 measured in current (amps). The damage 122 may be corrosion of the steel rod 110, spalling of the cladding 118 or other damage known to occur to cylinder rods 112. If the damage 122 is corrosion, the steel rod 110 will start to corrode and the magnetic properties, electric properties and physical geometry between the plurality of welds 120 and the steel rod will become less distinct. The sensor assembly 14 may no longer detect as strong a signal in this area. If the damage to the area is spalling, then a portion of the cladding 118 will be missing. The missing portion of the cladding 118 will result in increased signal strength. Being able to determine that damage 122 has occurred, and determine where on the cylinder rod 112 the damage occurred, will allow the operator to repair the damage prior to it spreading.

Figure 6:
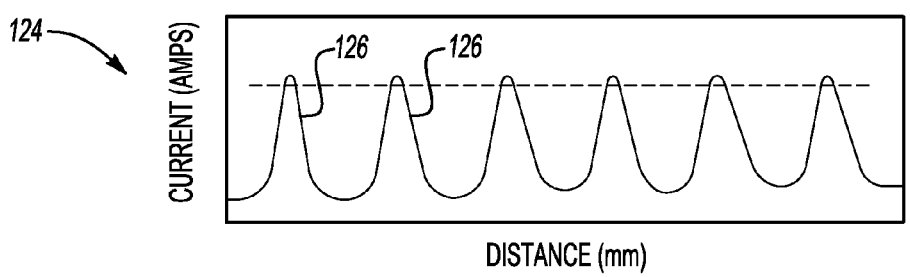
FIG. 6 is a schematic illustration of a graph of signal strength versus distance for the cylinder rods of FIG. 3 and FIG. 5.

FIG. 6 illustrates an output 124 from the sensor assembly 14 as the cylinder rod 12, 112 moves relative to the sensor assembly 14. Each pulse 126 represents a known distance of travel of the cylinder rod 12, 112 relative to the sensor assembly 14. The closer the plurality of welds 20, 120 are to one another the more refined the distance measurement will be. For example, in the embodiment shown, the plurality of welds each have a pitch of 2 mm spacing from one another. Therefore, each pulse represents 2 mm of travel of the cylinder rod 12, 112.

Figure 7:
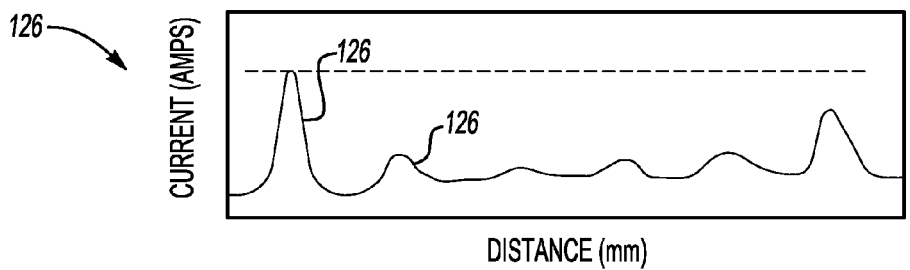
FIG. 7 is a schematic illustration of a graph of signal strength versus distance for the cylinder rod of FIG. 5 illustrating damage to the cylinder rod.

FIG. 7 illustrates an output 128 from the sensor assembly 14 as the cylinder rod 112 moves relative to the sensor assembly 14. The output 128 is illustrated as the sensor assembly 14 moves over the damaged portion 122 (illustrated in FIG. 5). Each pulse 126 represents a known distance of travel of the cylinder rod 112 relative to the sensor assembly 14. However, due to the damaged portion 122 on the cylinder rod 112, the difference in magnetic and electrical properties between the plurality of welds 118 and the steel rod 110 is degraded (representing corrosion). The difference in signal strength indicates that damage has occurred at that area of the cylinder rod 112. The difference in the amplitude between the signal strength of the cylinder rod 112 at a healthy portion and at the damaged portion 122 may also indicate the extent of damage that has occurred.

Other forms of damage may result in different signal strengths sensed by the sensor assembly 14. For example, if the damaged portion 122 is due to spalling then a portion of the cladding 118 will be missing and the signal strength in this area will increase, until corrosions sets in, in which case it will decrease again. Therefore, changes in the signal strength sensed by the sensor assembly 14 will represent damage to the cylinder rod 112. Another form of damage may be a metal particle that becomes embedded in the cylinder rod 112. The metal particle would result in an increase in signal strength recorded by the sensor assembly 14, similar to the spalling. However, the area of increased signal strength would likely be much smaller. Knowing where damage has occurred on the cylinder rod 112, if any, allows for the damage to be quickly repaired prior to getting worse.

While the best modes for carrying out the invention have been described in detail, those familiar with the art to which this invention relates will recognize various alternative designs and embodiments for practicing the invention within the scope of the appended claims.

The invention claimed is:

1. A method for detecting a position and damage of a cylinder rod comprising:
    depositing a plurality of welds substantially along a length of a steel rod;
    depositing a corrosion resistant material onto the steel rod by cladding;
    placing the cylinder rod proximate to at least one sensor assembly;
    moving one of the cylinder rod and the at least one sensor assembly relative to the other of the cylinder rod and the at least one sensor assembly; and
    measuring a change in at least one of magnetic properties, electric properties and physical geometry of the cylinder rod via the at least one sensor assembly to detect at least one of a change in position of the cylinder rod and damage to the cylinder rod.

2. The method of claim 1, wherein depositing the plurality of welds is by laser welding.

3. The method of claim 1, further comprising polishing the cylinder rod to remove a portion of the weld material.

4. The method of claim 1, further comprising polishing the cylinder rod to remove a portion of the corrosion resistant material.

5. The method of claim 1, wherein the at least one sensor assembly is an eddy current probe.

6. The method of claim 1, wherein measuring the change of one of the magnetic properties, electric properties and physical geometry includes generating a plurality of pulses due to the change in magnetic properties, electric properties and physical geometry between the plurality of welds and one of the steel rod and the cladding material, as the one of the cylinder rod and the at least one sensor assembly move relative to the other of the cylinder rod and the at least one sensor assembly.

7. The method of claim 6, wherein measuring the change further includes calculating a distance of movement of one of the cylinder rod and the at least one sensor assembly relative to the other of the cylinder rod and the at least one sensor assembly based on the number of pulses measured by the at least one sensor assembly.

8. The method of claim 6, wherein measuring the change further includes locating a damaged portion on the cylinder rod based on the amplitude for each of the plurality pulses measured by the at least one sensor assembly.

9. The method of claim 6, wherein measuring the change in on of the magnetic properties, electric properties and physical geometry further includes one of:
    the plurality of welds creating a signal that is disrupted by the cladding; and
    the plurality of welds disrupting a signal that is created by the steel rod when one of the cylinder rod and the at least one sensor assembly move relative to the other of the cylinder rod and the at least one sensor assembly.

10. The method of claim 1, wherein placing the at least one sensor assembly proximate to the cylinder rod includes placing two sensor assemblies proximate to the cylinder rod such that the two sensor assemblies are out of phase with one another.

11. The method of claim 1, wherein plurality of welds deposited substantially along the length of the cylinder rod are deposited on the corrosion resistant material after depositing the corrosion resistant material onto the cylinder rod.

12. The method of claim 1, wherein depositing the plurality of welds substantially along the length of the cylinder rod further are deposited prior to depositing the corrosion resistant material onto the steel rod.

13. A method for detecting a position of a cylinder rod comprising:
    depositing a corrosion resistant material onto a steel rod by laser cladding;
    depositing a plurality of circumferential welds substantially along the length of the steel rod, wherein the plurality of circumferential welds are made using a non-ferromagnetic material;
    polishing the cylinder rod to remove a portion of the corrosion resistant material;
    placing the cylinder rod proximate to at least one eddy current probe;
    moving one of the cylinder rod and the at least one eddy current probe relative to the other of the cylinder rod and the at least one eddy current probe; and
    measuring a change in one of magnetic properties, electric properties and physical geometry of the cylinder rod via the at least one eddy current probe to detect a change in position of the cylinder rod.

14. The method of claim 13, further comprising polishing the cylinder rod to remove a portion of the weld material.

15. The method of claim 13, wherein measuring the change in one of magnetic properties, electric properties and physical geometry further includes generating a plurality of pulses due to the change in magnetic properties between the plurality of circumferential welds and one of the steel rod and the cladding material as the one of the cylinder rod and the at least one eddy current probe moves relative to the other of the cylinder rod and the at least one eddy current probe.

16. The method of claim 15, wherein measuring the change further includes locating a damaged portion of the cylinder rod based on the amplitude of each of the generated pulses.

17. The method of claim 16, wherein measuring the change in one of the magnetic properties, electric properties and physical geometry further includes one of;
    the plurality of circumferential welds creating a signal that is disrupted by the cladding; and
    the plurality of circumferential welds disrupting a signal that is created by the steel rod when the one of the cylinder rod and the at least one eddy current probe moves relative to the other of the cylinder rod and the at least one eddy current probe.

18. The method of claim 13, wherein measuring the change further includes calculating a distance of movement of the one of the cylinder rod and the at least one eddy current probe moved relative to the other of the cylinder rod and the at least one eddy current probe based on the number of pulses measured by the at least one eddy current probe.

19. The method of claim 13, wherein placing the at least one eddy current probe proximate to the cylinder rod further includes placing two eddy current probes proximate to the cylinder rod such that the two eddy current probes are 90 degrees out of phase with one another.

20. The method of claim 13, wherein depositing the plurality of circumferential welds further includes fusion welding the non-ferromagnetic material to the steel rod.

* * * * *